(12) United States Patent
Boesche et al.

(10) Patent No.: US 11,011,903 B2
(45) Date of Patent: May 18, 2021

(54) DISCONNECTING DEVICE

(71) Applicant: Ellenberger & Poensgen GmbH, Altdorf (DE)

(72) Inventors: Dirk Boesche, Seershausen (DE); Ernst-Dieter Wilkening, Braunschweig (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 156 days.

(21) Appl. No.: 16/288,902

(22) Filed: Feb. 28, 2019

(65) Prior Publication Data

US 2019/0199082 A1 Jun. 27, 2019

Related U.S. Application Data

(63) Continuation of application No. PCT/EP2017/067225, filed on Jul. 10, 2017.

(30) Foreign Application Priority Data

Aug. 30, 2016 (DE) ...................... 10 2016 216 331.0

(51) Int. Cl.
*H02H 3/05* (2006.01)
*H02H 3/02* (2006.01)
(Continued)

(52) U.S. Cl.
CPC ......... *H02H 3/025* (2013.01); *G01R 19/0092* (2013.01); *H02H 3/05* (2013.01); *H02H 3/0935* (2013.01); *H02H 7/222* (2013.01); *H02H 9/042* (2013.01); *H03K 19/003* (2013.01); *H01H 9/541* (2013.01)

(58) Field of Classification Search
USPC .................................................. 361/91.1, 111
See application file for complete search history.

(56) References Cited

U.S. PATENT DOCUMENTS 4,459,629 A * 7/1984 Titus ...................... H01H 9/541
361/3
6,075,684 A * 6/2000 Duba ................ H03K 17/08142
361/4
(Continued)

FOREIGN PATENT DOCUMENTS

DE    102010007452 A1    8/2011
DE    102014110481 A1    1/2016
(Continued)

OTHER PUBLICATIONS

International Search Report dated Nov. 9, 2017 in corresponding application PCT/EP2017/067225.

(Continued)

*Primary Examiner* — Danny Nguyen
(74) *Attorney, Agent, or Firm* — Muncy, Geissler, Olds & Lowe, P.C.

(57) ABSTRACT

A disconnecting device for interrupting current, in particular of a circuit breaker, having a switch and a voltage limiter connected in parallel to the switch. The voltage limiter has a number of parallel-connected phases, each phase including a resistor. At least one of the phases includes a switching element, which is connected in series to the resistor of the phase.

9 Claims, 3 Drawing Sheets

(51) Int. Cl.
*H02H 7/22* (2006.01)
*G01R 19/00* (2006.01)
*H02H 3/093* (2006.01)
*H02H 9/04* (2006.01)
*H03K 19/003* (2006.01)
*H01H 9/54* (2006.01)

(56) References Cited

U.S. PATENT DOCUMENTS

| | | |
|---|---|---|
| 7,268,992 B2 | 9/2007 | Hallak et al. |
| 7,453,680 B2 | 11/2008 | Hallak et al. |
| 10,116,132 B2 | 10/2018 | Lee et al. |
| 2012/0250205 A1* | 10/2012 | Pfitzer ............... H02H 9/041 |
| | | 361/91.1 |
| 2012/0306264 A1 | 12/2012 | Komma et al. |
| 2014/0126098 A1 | 5/2014 | Sarrus et al. |
| 2015/0002977 A1* | 1/2015 | Dupraz ............... H01H 9/542 |
| | | 361/115 |

FOREIGN PATENT DOCUMENTS

| | | |
|---|---|---|
| EP | 3010030 A1 | 4/2016 |
| JP | 4532735 A | 8/2010 |
| WO | WO02082611 A2 | 10/2002 |

OTHER PUBLICATIONS

Korean Office Action dated Sep. 11, 2020 in corresponding application 10-2019-7008902.

* cited by examiner

DISCONNECTING DEVICE

This nonprovisional application is a continuation of International Application No. PCT/EP2017/067225, which was filed on Jul. 10, 2017, and which claims priority to German Patent Application No. 10 2016 216 331.0, which was filed in Germany on Aug. 30, 2016, and which are both herein incorporated by reference.

BACKGROUND OF THE INVENTION

Field of the Invention

The present invention relates to a disconnecting device for interrupting current, comprising a switch. The disconnecting device is preferably part of a circuit breaker. The invention also relates to a circuit breaker and a method for operating a disconnecting device.

Description of the Background Art

Photovoltaic systems usually have a number of photovoltaic modules, which are electrically connected in series or in parallel to each other. The interconnection of the photovoltaic modules itself is contacted with the aid of a current lead with a converter, with the aid of which the electrical energy provided by the photovoltaic modules is fed into a supply network, which usually has an alternating current. As a matter of principle, however, a direct current is usually conducted in the current lead. To disconnect the photovoltaic modules from the converter in the event of a fault, circuit breakers are customarily used, with the aid of which a damage to the converter or a contact erosion of the photovoltaic modules due to an existing electrical current flow is prevented. Electrical currents having a current intensity of some 10 amperes are usually switched, an electrical voltage having some 100 volts being present at the contacts due to a suitable interconnection within the photovoltaic module.

Vehicles, for example aircraft or motor vehicles, represent another field of application for circuit breakers to interrupt direct current. Motor vehicles driven with the aid of an electric motor usually have a high-voltage vehicle electrical system, which includes a high-voltage battery. An electrical voltage between 400 and 500 volts and a current intensity up to some 100 amperes are provided with the aid of the high-voltage battery. If a malfunction of the high-voltage battery or a short-circuit occurs within the converter or electric motor connected hereto, a preferably rapid shutdown of the high-voltage vehicle electrical system is necessary for safety reasons. To avoid a contact erosion of the high-voltage battery, a preferably short switching period is necessary. This must be ensured even in the case of an accident of the motor vehicle and a thereby resulting short-circuit within the electric motor or converter.

When currents of this type or electrical voltages of this type are switched, this may cause an arc to form in the area of the switch, provided that the latter is a mechanical switch. As a result, the switch and its surrounding components heat up, which may cause a failure, including a contact erosion, of the switch. A current flow also continues for a certain period of time, due to the arc, so that, if an accident occurs, the electric motor continues to operate for a certain period of time, for example in the case of a motor vehicle.

SUMMARY OF THE INVENTION

The object of the invention is to specify a particularly suitable disconnecting device for interrupting current as well as a particularly suitable circuit breaker and a particularly suitable method for operating a disconnecting device, a safety, in particular, being increased and manufacturing costs preferably being reduced.

The disconnecting device is used to interrupt current. An electrical current, which is, for example, a direct current or an alternating current, is therefore switched with the aid of the disconnecting device. The disconnecting device is advantageously provided and suitable for interrupting a direct current. If an alternating current is switched with the aid of the disconnecting device, it has, for example, a frequency greater than 500 Hz, 800 Hz or 900 Hz. The frequency is advantageously greater than or equal to 1 kHz, 1.5 kHz, 2 kHz, 5 kHz or 10 kHz. In particular, the frequency is less than or equal to 10 MHz, 5 MHz or 1 MHz. In particular, the disconnecting device is suitable, preferably provided and configured, to carry a rated current greater than or equal to 100 A, 300 A, 500 A or 800 A. The maximum electrical current intensity of the rated current switchable with the aid of the disconnecting device is advantageously 2 kA, 3 kA or 5 kA. For example, the disconnecting device is provided and configured for a rated current of 1 kA, deviations of, for example +/−10%, +/−5% or +/−2% being provided. The disconnecting device is fittingly suitable, in particular provided and configured, to carry a short-circuit current of up to 10 kA, 12 kA, 17 kA, 20 kA, 22 kA, 25 kA or 30 kA, in particular for a comparatively short period of time. The maximum carryable short-circuit current is advantageous between 15 kA and 20 kA. Carryable current is understood to be, in particular, the electrical current which may be conducted with the aid of the disconnecting device without a damage being induced thereby.

For example, the disconnecting device is suitable, preferably provided and configured, to disconnect or switch an electrical current greater than or equal to 100 V, 200 V, 300 V, 400 V or 500 V. For example, the maximum electrical voltage to be switched is 1,100 V, 1,000 V, 900 V or 800 V, in particular if the electrical current is an alternating current. If the electrical current is a direct current, the maximum electrical voltage to be switched is suitably less than or equal to 2,000 V, 1,800 V, 1,500 V, 1,200 V or 1,000 V.

For example, the disconnecting device is used in the area of e-mobility. In other words, an electrical system of a motor vehicle, which is, in particular, a high-voltage vehicle electrical system, is switched with the aid of the disconnecting device. Alternatively, an electrical system of an aircraft is switched with the aid of the disconnecting device. Another alternative use is in the area of a photovoltaic system. An electrical disconnection of a photovoltaic module from a converter is advantageously facilitated with the aid of the disconnecting device. Alternatively, a DC link of a converter is switched with the aid of the disconnecting device, the converter being, for example, part of a photovoltaic system. In one alternative hereto, the converter is part of an industrial plant. An energizing of a robot of the industrial plant is advantageously controlled with the aid of the disconnecting device. In particular, a DC link, with which a number of robots are electrically contacted, is switched with the aid of the disconnecting device. Alternatively, the disconnecting device is used in another area of the industrial plant or in another area of automation. The disconnecting device is advantageously used to switch an inductive load.

The disconnecting device comprises a switch, which carries an electrical current conducted with the aid of the disconnecting device in the closed state. In this case, an electrical current preferably flows between two terminals of the switch. In the open state, an electrical voltage is present between the two terminals. The electric switch is, for example, a mechanical switch, which is advantageously electrically actuatable. The mechanical switch is advantageously a relay and has, in particular, a moving contact. In the closed state, the moving contact, in particular directly mechanically abuts another contact, which is, in particular, also a moving contact or alternatively a fixed contact. To operate the switch, the two contacts are mechanically placed at a distance from each other. In one alternative, the switch is a semiconductor switch, in particular a field effect transistor (FET). For example, the semiconductor switch is a MOSFET or an IGBT.

A voltage limiter is connected in parallel to the switch. The voltage limiter preferably has two terminals, each of which is assigned to one of the terminals of the switch. The voltage limiter has a number of parallel-connected phases, each phase being advantageously connected in parallel to the switch. Each of the phases includes a resistor, and at least one of the phases includes a switching element, which is connect in series to the resistor of the phase. In other words, this phase includes the resistor and the switching element, the switching element and the resistor being connected in series. This series connection is connected in parallel to the switch. The resistors of the phases are advantageously ohmic resistors and preferably have a resistance of at least 1 mohm, 5 mohms, 10 mohms, 50 mohms, 100 mohms, 500 mohms, 1 ohm, 2 ohms, 5 ohms, 10 ohms, 20 ohms, 50 ohms, 100 ohms, 200 ohms, 500 ohms, 1 kohm, 2 kohms, 5 kohms or 10 kohms. The resistance is preferably less than or equal to 1 kohm, 500 ohms or 100 ohms. The voltage limiter preferably includes 2 phases, 3 phases or 5 phases. In particular, the number of phases is greater than or equal to 2 phases, 3 phases or 4 phases. For example, the number of phases is less than or equal to 20 phases or 10 phases.

The switching element makes it possible to prevent a current flow in the phase having the switching element and therefore to set the electrical resistance of the voltage limiter. As a result, the electrical voltage arising across the switch may be set with the aid of the voltage limiter, which increases safety. The disconnecting device may also be used for different requirements.

The switching element is advantageously actuated as a function of an electrical voltage arising across the switch and/or a switching request for the switch. The switching element is suitably placed in an electrically conductive state when the switch is placed in an electrically non-conductive state. The switching element is advantageously placed in the electrically conductive state a period of time before the actuation of the switch. As a result, an electrical current flows both across the switch and across each of the phases of the voltage limiter. Due to the resistances of the phases, the electrical current flowing across the voltage limiter is comparatively low, at least compared to the electrical current flowing across the switch, since the switch has a comparatively low ohmic resistance. When the switch is actuated, the electrical current fully commutates to the voltage limiter.

If an inductive load is switched with the aid of the disconnecting device, the electrical current continues to flow, an electrical voltage being present at the disconnecting device, due to the resistances. The electrical voltage is comparatively low, due to the parallel connection of the phases. The switching element makes it possible to disconnect the phase containing the switching element, and the electrical current therefore fully commutates to the phase or the additional phases of the voltage limiter, so that the resistance of the voltage limiter is increased.

The electrical resistance of the voltage limiter may be adjusted with the aid of the switching element, so that an electrical voltage arising across the disconnecting device may be adjusted upon an actuation of the switch. A scalability of the disconnecting device is provided by means of the number of phases and by selecting the particular resistor, so that the disconnecting device may be adapted to different electrical voltages and/or electrical currents. As a result, an application range of the disconnecting device is increased. The electrical voltage arising across the switch is limited with the aid of the phases. The electrical voltage is preferably limited in such a way that a formation of an arc is prevented, provided that the switch is a mechanical switch. If the switch is a semiconductor switch, the formation of a breakdown voltage present thereat is suppressed, which could result in a destruction of the semiconductor switch. Safety is therefore increased. The disconnecting device may also be implemented by a comparatively small number of cost-effective electric components, which lowers manufacturing costs.

The switching element is, in particular, a semiconductor switching element, for example a transistor, such as a field effect transistor, in particular a MOSFET. For example, the switching element is a field effect transistor, a junction gate field effect transistor (JFET) or a MOSFET. Since the electrical voltages are distributed to the phases, an electrical voltage which is reduced compared to the switch is present at the switching element, and a comparatively cost-effective switching element may therefore be used. The disconnecting device is in an electrically conductive state when the switch of the disconnecting device is closed. The electrical current conducted by the switching element, provided that the latter is in a closed state, is comparatively low, due to the resistance of the phase, so that a power loss caused by the selection of the switching element as the semiconductor switching element is comparatively low.

When the electrical current is commutated to the voltage limiter when the switch is placed in an open position and the disconnecting device is transferred into an electrically non-conductive state, the electrical current is further reduced, due to the resistances of the phases, so that a comparatively low power loss occurs in this case as well. In summary, only a comparatively low power loss exists. Due to the selection of a semiconductor switching element, however, a formation of an arc is prevented, and safety is therefore increased.

Each phase advantageously has a switching element of this type. The switching elements of the phases are, for example, of the same design. Alternatively or in combination herewith, the switching elements are adapted to the resistance of the particular phase. In summary, each phase includes both the resistor and the switching element, which are connected in series to each other. Due to the switching elements, a scalability of the disconnecting device is thus increased, so that the electrical resistance of the disconnecting device, and consequently the electrical voltage present at the switch, may be set with the aid of the switching elements. In particular, the phases are of the same design. In other words, all resistors have the same ohmic resistance and all switching elements are of the same type. However, the phases are at least circuit-equivalent. In other words, each phase includes the same type of electric and/or electronic components, it being possible, however, for the particular specifications to be different. The electric and/or electronic components are connected to each other in the same way. The phases suitably include resistors having different ohmic resistances. If the disconnecting device has a number of phases, the values of the ohmic resistance are preferably increased by a certain constant multiple in each case. The multiple is, in particular, an integral multiple and is, for example, two or three. In each case, one of the phases suitably has an ohmic resistance of 20 ohms, 40 ohms, 80 ohms, etc. or 20 ohms, 60 ohms, 180 ohms, etc., provided that the smallest resistor in each case has an ohmic resistance of 20 ohms. A comparatively precise setting of the electrical voltage arising across the switch is facilitated in this way. Manufacturing costs are also reduced, due to the use of equivalent parts.

The voltage limiter preferably includes a shift register, which has a first output and a second output. The second output is preferably situated right next to the first output. During the operation of the shift registered, the first output is preferably driven first, followed by the second output. The second output is advantageously driven exactly when the driving of the first output is completed. When the shift register is driven, a driving of the first output is thus ended and the driving of the second output begun.

Each switching element preferably has a control input, with the aid of which a switching position of the switching element may be influenced. In other words, the switching state of the switching element is influenced by driving the control input, and the switching element is consequently placed into a conductive or an electrically non-conductive state. The switching element is advantageously electrically conductive when a signal is present at the control input, i.e. when the latter is driven. The control input of one of the switching elements is routed to the first output of the shift register, in particular directly. In other words, the control input of this switching element is contacted with the first output of the shift registered either directly electrically or directly via signals. Moreover, the control input of this switching element is routed to a first input of an OR logic switch.

A second input of the OR logic switch is routed to the second output of the shift register, in particular directly. The OR logic switch also has an output, which is routed to the control input of one of the additional switching elements. If a level is present at one of the inputs of the OR logic switch, a level is also preferably present at the output of the OR logic switch. The OR logic switch is therefore active, provided that an active signal is present at one of its two inputs. The output of the OR logic switch is inactive only of an active signal (level) is not present at either the first or the second input. The OR logic switch is, in particular, an OR gate. If a signal is thus present at the first output due to the shift register, the switching element coupled with the first output is activated. The additional switching element is also activated, since a signal is present at the first input of the OR logic switch. At least two switching elements of the voltage limiter are therefore switched, and at least two of the phases of the voltage limiter are therefore electrically conductive. As a result, the electrical voltage falling across the switch is comparatively low.

If the output signal is shifted from the first output to the second output with the aid of the shift register, the switching element whose control input is contacted with the first output is placed into the electrically non-conductive state. The additional switching element, however, remains in an electrically conductive state. As a result, the electrical resistance of the voltage limiter is increased. The shift register preferably has even more outputs, for example, a third, fourth, fifth, etc. output. In particular, the number of these outputs is equal to the number of phases. In each case, the control input if the switching elements is routed to the output of an OR logic switch, whose one input is routed to the control input of another switching element and whose second input is routed to one of the outputs of the shift register.

In particular, the control input of a third switching element, which is assigned to a third phase, is routed to an output of a second OR logic switch, whose first input is routed to the control input of the additional switching element and whose second input is routed to the third output of the shift register. All switching elements are therefore electrically conductively switched if the first output of the shift register is driven. If the second output of the shift register is now driven, all remaining switching elements are activated, except for the switching element contacted with the first output, so that the number of electrically conducive phases of the voltage limiter is reduced by exactly 1. If the third output of the shift register is driven, two of the phases of the voltage limiter are electrically non-conductive. As result, this makes it possible to successively increase the electrical resistance of the voltage limiter step by step by driving the shift register.

The first output of the shift register corresponds, in particular, to a channel 1, and the second output corresponds, in particular, to a channel 2. A start output of the shift register is particularly preferably free. The start output corresponds, in particular, to a channel 0 and is situated upstream from the first output. In particular, the first output is situated between the start output and the second output. The start output is driven upon the driving of the shift register. The driving of the start output is ended and the driving of the first output begun only when the shift register receives a signal.

The start output is not assigned, and no electric or electronic component is connected thereto. The start output is therefore electrically loose, and no other or electronic component is electrically contacted therewith. In the normal state, therefore, the switching elements are in the electrically non-conductive state, and the electrical resistance of the voltage limiter is comparatively high. If the shift register or other components of the voltage register malfunctions, an unwanted electrical current flow across the voltage limiter is therefore essentially ruled out, even if the electrical voltage arising across the switch is comparatively high.

The shift register advantageously includes a reset input. The shift register is placed into a defined state by driving the reset input. In particular, the start output of the shift register is activated when a signal is present at the reset input. An end output of the shift register is advantageously routed to the reset input. The end output of the shift register is, in particular, the output of the shift register which is situated right next to an output of the shift register which is routed to an OR logic switch. If only the first or second input of the OR logic switch is consequently assigned, i.e. if only two switching elements are driven with the aid of the shift register, the end output corresponds to the third output. If the number of driven switching elements was therefore successively reduced, the end output of the shift register is driven, and the shift register is then placed back into the original state. The start output of the shift register is advantageously free, so that it may be driven chronologically after the end output. If the end output is driven, none of the switching elements are thus driven, and none of the phases is therefore electrically conductive. A diode is advantageously connected between the end output and the reset input, which avoids damage to the shift register. In summary, the end output is the last assigned channel of the shift register.

Alternatively or particularly preferably in combination therewith, a power supply source is routed to the reset input of the shift register, for example via a capacitor. The power supply source itself is, for example, a capacitor. The capacitor is particularly preferably connected to the switch in such a way that, when the switch is opened, an electrical voltage generated via the switch is used to supply the power supply source. In particular, the switch is a mechanical switch, and any arc voltage that may arise is used to supply the power supply source. If the power supply source is then activated, the shift register is transferred into a certain defined state, so that it is ready for operation.

The shift register particularly preferably includes a time input. When the time input of the shift register is driven, the outputs of the shift register are successively made conductive. Each time a signal is present at the time input, the driving of the outputs is changed in such a way that they are further switched each time. The time input of the shift register is advantageously operatively connected to a control input of the switch. In particular, the operative connection is such that a driving of the outputs of the shift register is possible even if no signal is present at the control input of the switch. The switch is preferably in an electrically conductive state when a signal is present at the control input of the switch. The shift register is consequently activated when the switch is opened. In this way, an unintentional activation of the shift register is essentially ruled out, which increases safety.

The voltage limiter preferably includes a timer. The timer is operatively connected to the time input of the shift register. The shift register is therefore driven with the aid of the timer, a certain clock signal preferably being provided with the aid of the timer, which has, in particular, a constant period. For example, the timer is connected directly to the time input of the shift register. The control input of the switch is suitably routed to a first input of a logic switch, and a time output of the timer is routed to the second input of the logic switch. A driving signal is advantageously provided periodically at the time output of the timer. The output of the logic switch is routed, in particular, to the time input of the shift register. The output of the logic switch suitably has a level when a level is present at the first input of the logic switch and/or at the second input of the logic switch, the level designating, in particular, a signal which is other than zero (0). In other words, an output signal is present at the output of the logic switch when a driving signal is present at the first and/or at the second input. The control input of the switch is preferably operatively connected to the timer. A count, i.e. an output of the clock signal, is preferably prevented as long as a signal is present at the control input of the switch. In particular, the control input of the switch is connected to a reset terminal of the timer. As long as a signal is present at the reset terminal of the timer, the latter is held, in particular, in a basic or starting state. The shift register thus continues to be counted only when the switch of the disconnecting device is open.

For example, the logic switch is formed by or includes two NOR gates, the control input of the switch and the time output of the timer being routed to the two inputs of one of the NOR gates. The output of the NOR gate is split between the two inputs of the additional NOR gate, whose output is routed to the time input of the shift register.

The timer is, for example, an NE555. "OUT" is suitably the time output, which is routed, for example, to the logic switch or directly to the time input of the shift register. In particular, "OUT" is routed with the aid of a diode to the "TRIG" (trigger terminal), which is routed, in particular with the aid of a resistance divider, to a terminal of the switch, which preferably has an electrical potential other than zero (0) during operation. For example, "GND" (GND terminal) is routed to the remaining switching contact of the switch. For example, "RESET" (reset terminal) is operatively connected to the control input of the switch, for example with the aid of a NOR gate. The NE555 is advantageously implemented as a monostable flip-flop.

A series connection of another resistor and a capacitor is preferably connected in parallel to the switching element. If the voltage limiter has a number of circuit elements of this type, the series connection of the additional resistor and the capacitor are connected in parallel to at least one of the switching elements. The series connection of the additional resistor and the capacitor are preferably connected in parallel to only one of the switching elements, so that the voltage limiter has only one single additional resistor and one single capacitor. Alternatively, a series connection of an additional resistor and a capacitor is connected in parallel to a number of switching elements in each case, for example to all switching elements, so that the number of additional resistors and the number of capacitors each correspond to the number of switching elements. If the voltage limiter has a number of circuit elements of this type, whose control input in each case is routed to an output of the possible shift register via an OR logic switch, the series connection is preferably connected in parallel to the switching element which is routed to the output of the shift register adjacent to the end output. The capacitor is preferably a condenser. If the switching element is in the electrically non-conductive state, an RC circuit, which receives a possible, further flowing electrical current, is formed with the aid of the resistor of this phase as well as the additional resistor and the capacitor. An electrical current flow across the voltage limiter is thus always facilitated, even if the electrical resistance is comparatively high. The additional resistor is advantageously comparatively large so that the electrical current is routed to zero (0), even if a comparatively large inductor is switched with the aid of the disconnecting device. The flowing electrical current is comparatively low, due to the phases of the voltage limiter, so that the capacitor may be dimensioned to be comparatively small, which lowers manufacturing costs. An additional resistor is suitably connected in parallel to the capacitor. The additional resistor ensures that the capacitor is continuously discharged.

The voltage limiter is advantageously based on analog technology. In other words, the voltage limiter is built in analog technology. If the voltage limiter consequently includes the OR logic switch, the timer, the logic switch and/or the shift register, they are based, in particular, on analog technology or manufactured as such. A robustness is increased in this manner. Manufacturing costs are also reduced.

The disconnecting device is particularly preferably used in a circuit breaker. In particular, the disconnecting device is used to switch an inductive load, for example to disconnect it from a power grid. For example, an energy source, which is, for example, the power supply source, is used to operate the disconnecting device. In particular, the shift register, the timer and/or the switching element is/are energized with the aid of the energy source.

The circuit breaker includes a sensor and a disconnecting device, which are, in particular, coupled with each other, for example electrically or via signals. The disconnecting device comprises a switch and a voltage limiter connected in parallel to the switch, which has a number of phases connected in parallel to each other, each phase including a resistor, and at least one of the phases including a switching element which is connected in series to the resistor of the phase. The sensor is, for example, a voltage or current sensor. In other words, the sensor is made ready, in particular provided and configured, to detect an electrical current or an electrical voltage. In particular, an electrical current carried by the disconnecting device or a present electrical voltage or an electric potential difference with respect to a reference potential, such as mass, in particular ground, is detected with the aid of the sensor during operation. The disconnecting device is advantageously actuated as a function of a measured value of the sensor. In particular, the disconnecting device is actuated when the electrical current or the electrical voltage is greater than or equal to a threshold value. For example, the circuit breaker includes a control device, such as a microprocessor, with the aid of which the measured values of the sensor are evaluated and/or the switch is actuated.

The circuit breaker is electrically contacted, for example with the aid of a photovoltaic system or a photovoltaic module, and is part, for example, of a photovoltaic system or a photovoltaic power plant. In one alternative thereto, the circuit breaker is part of an electrical system of a vehicle, for example a high-voltage vehicle electrical system, which has an electrical voltage greater than 100 volts, 200 volts, 300 volts or 400 volts and, for example, less than 1,000 volts or 900 volts. The vehicle is, for example, an aircraft, and the electrical system is used, for example, to supply actuators of the aircraft. In one alternative, the vehicle is a motor vehicle, in particular an electric or hybrid vehicle. In particular, the circuit breaker is part of the vehicle electrical system, which is used to energize a main drive of the motor vehicle. Alternatively, the circuit breaker is part of an industrial plant and is preferably used to protect a robot, which is energized, for example, with the aid of a converter DC link.

The circuit breaker is provided, in particular, to switch electrical currents greater than or equal to 10 amperes, 100 amperes, 200 amperes, 300 amperes, 500 amperes or 600 amperes. The maximum electrical current intensity switchable with the aid of the circuit breaker is 900 amperes, 1,000 amperes, 1,500 amperes or 2,000 amperes. For example, the electrical voltage switchable with the aid of the circuit breaker is greater than 10 volts, 50 volts, 100 volts or 200 volts. In particular, the switchable electrical voltage is less than 500 volts, 600 volts, 700 volts or 1,000 volts.

To protect an electrical system of a vehicle, such as a motor vehicle or an aircraft, a circuit breaker is used which includes a sensor and a disconnecting device, which are, in particular, coupled with each other, for example electrically and/or via signals. The disconnecting device comprises a switch and a voltage limiter connected in parallel to the switch, which has a number of phases connected in parallel to each other, each phase including a resistor, and at least one of the phases including a switching element which is connected in series to the resistor of the phase. The sensor is, for example a voltage or current sensor.

The vehicle electrical system is particularly preferably a high-voltage vehicle electrical system, with the aid of which an electrical current having a current intensity greater than 10 amperes, 20, amperes, 50 amperes, 100 amperes or 200 amperes is conducted. In particular, the maximum electrical current intensity carried by the high-voltage vehicle electrical system is less than 2,000 amperes, 1,800 amperes or 1,500 amperes. In particular, the electrical voltage of the high-voltage vehicle electrical system is greater than 100 volts, 200 volts, 300 volts or 350 volts. The electrical voltage of the high-voltage vehicle electrical system is advantageously less than 1,000 volts, 800 volts or 600 volts.

Alternatively, the circuit breaker is used to protect a supply circuit, such as a DC link, of an industrial plant. In particular, a converter includes the circuit breaker. The circuit breaker is suitably used in an industrial application, for example to protect a robot. The supply circuit has, for example, an electrical voltage between 500 V and 1,000 V, in particular 800 V.

The method is used to operate a disconnecting device for interrupting current, in particular of a circuit breaker, which comprises a switch and a voltage limiter connected in parallel to the switch, which has a number of phases connected in parallel to each other, each phase including a resistor, and at least one of the phases including a switching element which is connected in series to the resistor of the phase. The method provides that the switching element is closed for a period of time after the switch is opened. The switching element is already placed into an electrically conductive state, for example for a second period of time before the switch is opened. The switching element is suitably closed when the switch is closed. Alternatively, the switching element is closed simultaneously with the opening of the switch. The switching element is opened at the end of the period of time.

When the switch is opened, the electrical current flowing across the disconnecting device thus fully commutates to the voltage limiter, i.e. to the phases. The electrical resistance is reduced due to the parallel connection of the resistors. The switching element is opened at the end of the period of time, which results in an increase in the electrical resistance of the voltage limiter. If the voltage limiter has a number of phases which include switching elements, the method provides that at least one of the switching elements, for example all switching elements, is closed for the period of time after the switch is opened. The switching elements are suitably opened successively over time, all switching elements advantageously being first closed when the switch is opened. The period of time is suitably present in each case between the actuation of the individual switches, so that the electrical resistance of the voltage limiter is increased.

If an inductive load is switched with the aid of the disconnecting device, the electrical voltage arising across the switch is limited. At the end of the period of time, the flowing electrical current is reduced due to the electrical resistance of the voltage limiter. If the switching element is now actuated, the electrical resistance, and consequently the electrical voltage, is increased again. This results in another and more pronounced reduction in the electrical current flow. The electrical current flow is thus successively prevented by increasing the electrical resistance, the maximum electrical voltage present being reduced. A comparatively cost-effective switch may therefore be used. An arc is thus prevented in a mechanical switch. In a switch based on semiconductor technology, a comparatively low electric strength is required. If the capacitor and the additional resistor are connected in parallel to the switching element, any electrical current flow still remaining is absorbed with the aid of this series connection after actuating the switching element and brought to zero.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
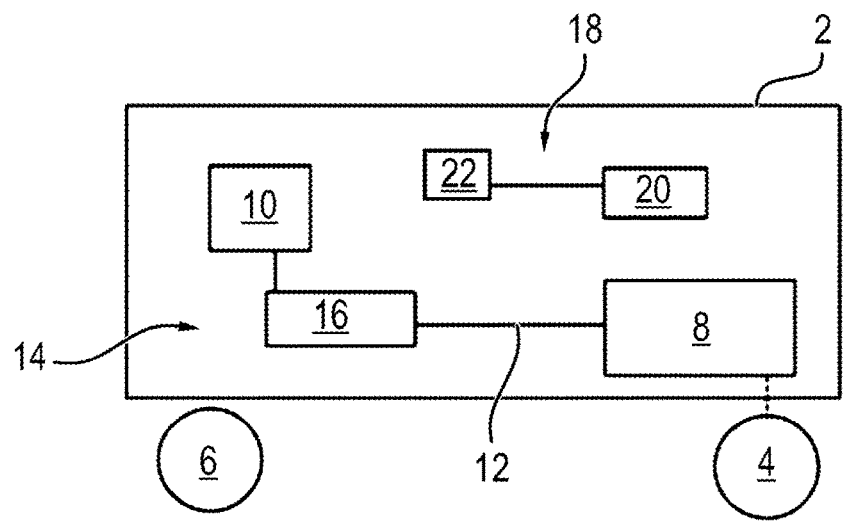
FIG. 1 shows a schematically simplified view of a moor vehicle, which includes a high-voltage vehicle electrical system having a circuit breaker.

FIG. 1 shows a schematically simplified view of a motor vehicle 2, which includes drive wheels 4 as well as non-driven wheels 6. Drive wheels 4 are coupled with an electric motor 8. which includes a converter. Converter/electric motor 8 is energized with the aid of a high-voltage battery 10, by means of which an electrical energy is provided, an electrical voltage of 400 volts being present between the two poles of the high-voltage battery. High-voltage battery 10 is coupled with converter/electric motor 8 by an electric line 12, an electrical current flow of up to 1,000 amperes being conducted with the aid of electric line 12. High-voltage battery 10, electric line 12 and converter/electric motor 8 are components of a high-voltage vehicle electrical system 14.

To protect high-voltage vehicle electrical system 14, the latter includes a circuit breaker 16, which is activated in the case of an overcurrent, i.e. in the case of a electrical current flow that exceeds 1,000 amperes and is produced, for example, due to a short-circuit within converter/electric motor 8, and consequently electrically disconnects high-voltage battery 10 from converter/electric motor 8. Motor vehicle 2 also includes a low-voltage vehicle electrical system 18, which has a low-voltage battery 20, with an electrical current of 12 voltage or 48 volts being present between its particular electric poles. Low-voltage electrical vehicle system 18 furthermore has a number of actuators 22, with the aid of which adjusting parts, such as windows or seats, may be electrically adjusted.

Figure 2:
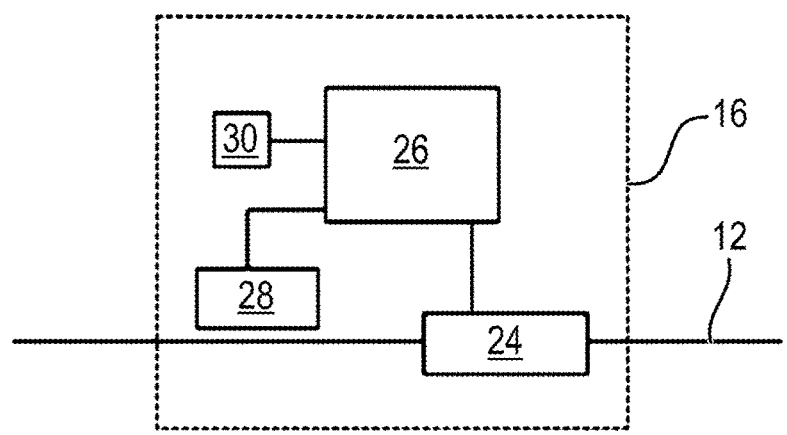
FIG. 2 shows a schematic view of the circuit breaker, including a disconnecting device.

FIG. 2 shows a schematically simplified view of circuit breaker 16, which includes a disconnecting device 24. which is introduced into electric line 12. Disconnecting device 24 makes it possible to interrupt an electrical current flow across the electric line 12. Disconnecting device 24 is coupled via signals with a control unit 26, which is coupled via signals with a sensor 28. Sensor 28 is a current sensor, with the aid of which an electrical current flow prevailing in electric line 12 may be contactlessly measured. For this purpose, sensor 28 includes a Hall sensor. Control unit 26 is also coupled with an interface 30, which is connected in the assembled state to a bus system of motor vehicle 2. Control unit 26 may be controlled with the aid of interface 30. During operation, an overcurrent is detected, for example with the aid of sensor 28, or a certain signal is received via interface 30. Disconnecting device 24 is subsequently actuated with the aid of control unit 26, so that an electrical current flow across electric line 12 is prevented. Once this has taken place, the state of disconnecting device 24 is forwarded to the bus system via interface 30.

Figure 3:
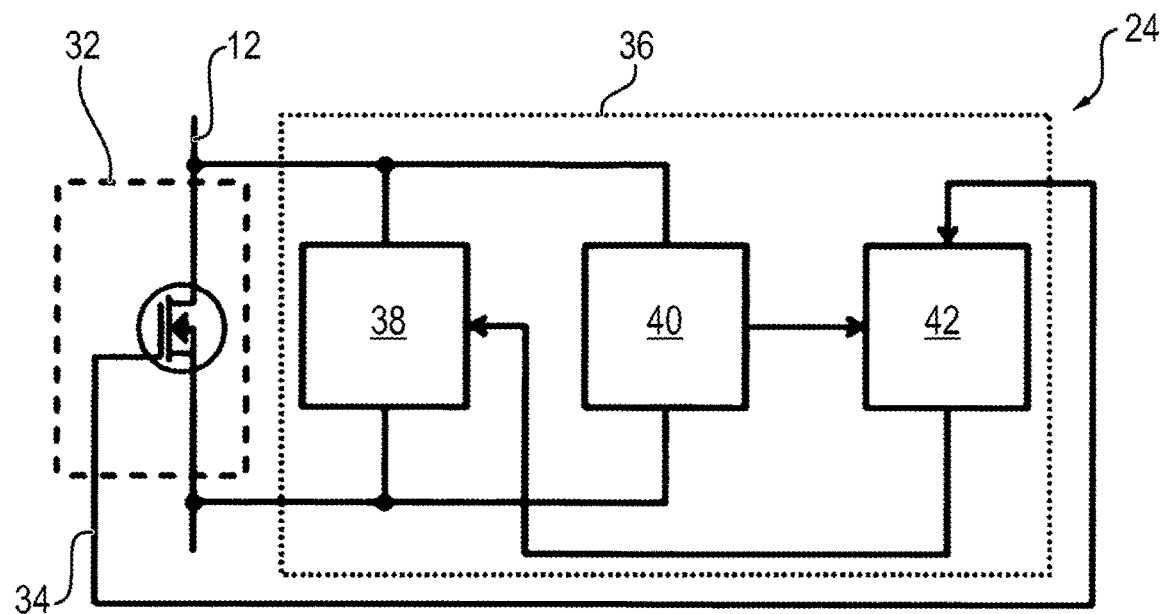
FIG. 3 shows a schematic view of the disconnecting device.

FIG. 3 shows a schematically simplified view of disconnecting device 24. Disconnecting device 24 comprises a switch 32, which is introduced into electric line 12. The switch includes an IGBT and has a control input 34, with the aid of which the switching state of the IGBT may be changed. A voltage limiter 36 is connected in parallel to switch 32. In other words, switch 32 is bridged with the aid of voltage limiter 36. Voltage limiter 36 has a number of circuit-equivalent phases 38 connected in parallel to each other. All phases 38 are connected in parallel to switch 32. Voltage limiter 36 also includes a timer 40. Timer 40 is an NE555 chip, and an electrical voltage is present at timer 40 when switch 32 is in an open position, i.e. is electrically non-conductive. Voltage limiter 36 includes a shift register 42. Shift register 42 is supplied with certain clocks with the aid of the timer. Shift register 42 is also operatively connected to control input 34 of switch 32. Phase 38 are controlled with the aid of shift register 42. Voltage limiter 36 is based on analog technology. In other words, phases 38 as well as timer 40 and shift register 42 are designed as analog components.

Figure 4:
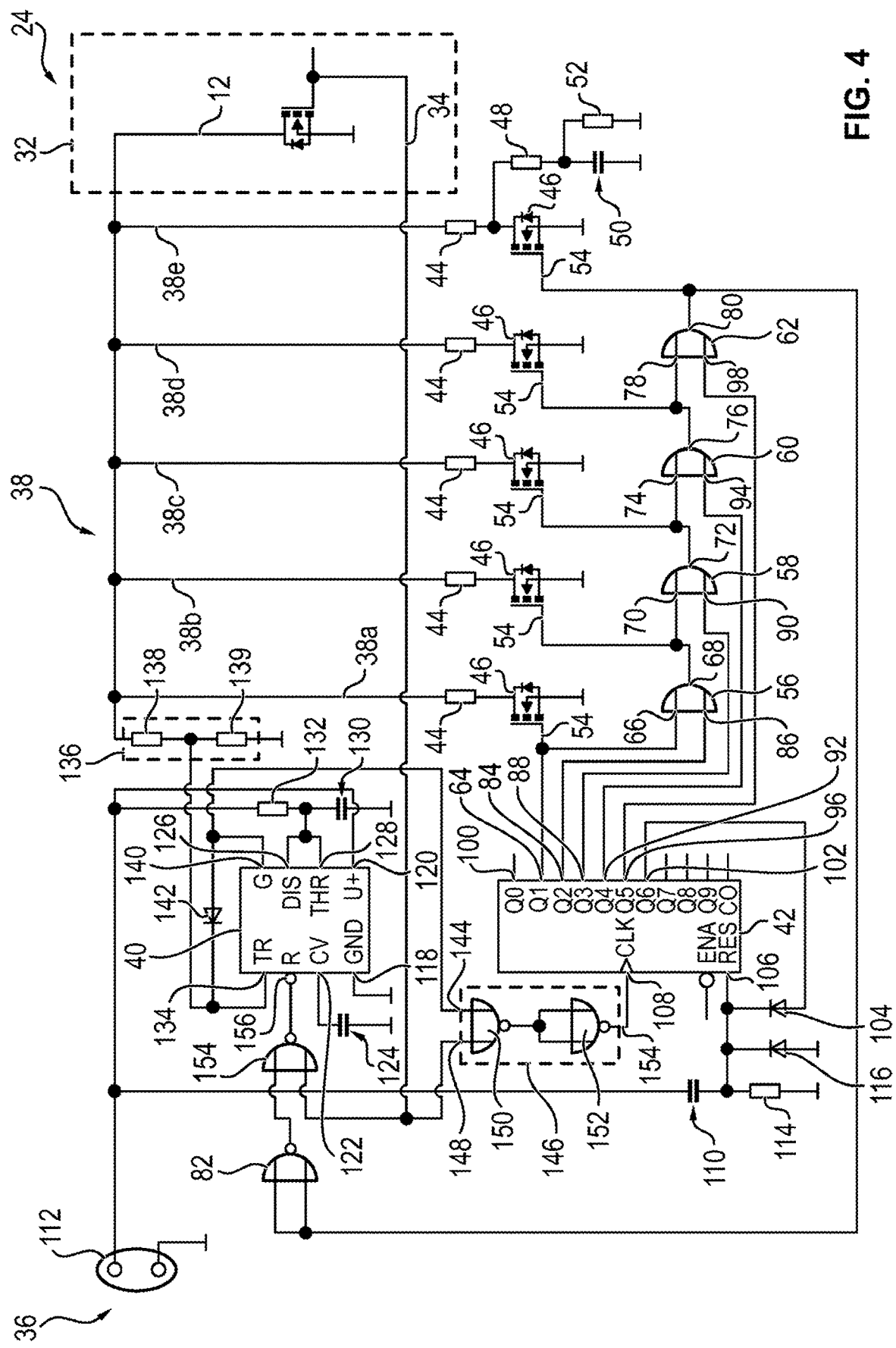
FIG. 4 shows a circuit diagram of the disconnecting device.

FIG. 4 shows a comparatively detailed circuit diagram of disconnecting device 36, including phases 38 connected in parallel to switch 32. Voltage limiter 36 has a first phase 38a, a second phase 38b, a third phase 38c, a fourth phase 38d and a fifth phase 38e, which are connected in parallel to each other and in parallel to switch 32. For example, one of the terminals of switch 32 is routed to ground, so that all phases 38a, 38b, 38c, 38d, 38e are also routed to ground. Phases 38 are of the same design and each include a resistor 44 and a switching element 46 in the form of an IGBT. In summary, each of phases 38 has one of switching elements 46. Resistor 44 and switching element 46 of each phase 38 are connected in series to each other. The ohmic resistance of individual phases 38a, 38b, 38c, 38d, 38e is at least partially increased by an integral multiple in each case. The ohmic resistance of resistor 44 of first phase 38a is 20 ohms, the ohmic resistance of resistor 44 of second phase 38b is 40 ohms, the ohmic resistance of resistor 44 of third phase 38c is 80 ohms, and the ohmic resistance of resistor 44 of fourth and fifth phases 38d, 38e is 160 ohms in each case. A series connection of a further resistor 48 and a capacitor 50 in the form of a condenser is connected in parallel to switching element 46 of fifth phase 38e. Capacitor 50 is routed to the potential of one of the terminals of switch 32, i.e. to ground. Capacitor 50 itself is bridged by an additional resistor 52, which is consequently connected in parallel to capacitor 50. Then ohmic resistance of further resistor 48 is equal to the ohmic resistance of resistor 44 of fifth phase 38e and is 160 ohms. The ohmic resistance of additional resistor 52 is, for example, 1 Mohm.

Each switching element 46 has a control input 54, with the aid of which the switching state of particular switching element 46 may be set. If switching element 46 is set with the aid of control input 54 in such a way that the it is in an electrically non-conductive state, a current flow across this particular phase 38 is prevented. Voltage limiter 36 includes a first OR logic switch 56, a second OR logic switch 58, a third OR logic switch 60 and a fourth OR logic switch 62, which are OR gates in each case. Control input 54 of switching element 46 of first phase 38a is routed to a first output 64 of shift register 42 as well as to a first input 66 of first OR logic switch 56. Control input 54 of switching element 46 of second phase 38b is routed to an output 68 of first logic switch 56 as well as to a first input 70 of second OR logic switch 58. Control input 54 of switching element 46 of third phase 38c is routed to an output 72 of second OR logic switch 58 as well as to a first input 72 of third OR logic switch 60. Control input 54 of switching element 46 of fourth phase 38d is routed to an output 76 of third OR logic switch 60 as well as to a first input 78 of fourth OR logic switch 62. Control input 54 of switching element 46 of fifth phase 38e is routed to an output 80 of fourth OR logic switch 62 as well as to both inputs of a first NOR gate 82.

A second output 84 of shift register 42 is routed to a second output 86 of first OR logic switch 56. A third output 88 of shift register 42 is routed to a second output 90 of second OR logic switch 58. A fourth output 92 of shift register 42 is routed to a second output 94 of third OR logic switch 60. A fifth output 96 of shift register 42 is routed to a second output 98 of fourth OR logic switch 62. OR logic switches 56, 58, 58, 60, 62 are of the same design. Moreover, a level is present at each of particular outputs 68, 72, 76, 80 when a level is present at at least one of inputs 66, 68 or 70, 90 or 74, 94 or 78, 98.

A start output 100 of shift register 42 is free and therefore not electrically contacted with any other electric or electronic component. End output 102 of shift register 42 is routed to a reset input 106 of shift register 42 via a first diode 104. Only a current flow from end output 102 to reset input 106 is facilitated by means of diode 104. If shift register 42 is activated, start output 100 is driven first. First output 64, second output 84, third output 88, fourth output 92 and fifth output 96 are subsequently driven, followed by end output 102, the driving taking place as a function of a driving signal present at a time input 108. Start output 100 this corresponds to channel Q0, first output 64 corresponds to channel Q1, second output 84 corresponds to channel Q2, etc. up to end output 102, which corresponds to channel Q6.

Reset input 106 of shift register 42 is routed via a second capacitor 110 to a power supply source 112, with the aid of which a direct current of 15 volts is provided. Reset input 106 is also routed to ground via a second resistor 114. A second diode 116 is connected in parallel to second resistor 114, with the aid of which a current flow from ground to reset input 106 is facilitated.

Timer 40 is connected as a monostable flip-flop. A GND terminal 118 is thus routed to ground, and a supply voltage terminal 120 is routed to power supply source 112. A control terminal 122 is routed to ground via a third capacitor 124. A discharge terminal 126 is routed to a threshold terminal 128 as well as to ground via a fourth capacitor 130. Discharge terminal 126 and threshold terminal 128 are also routed to power supply source 112 with the aid of a third resistor 132. A trigger terminal 134 is electrically contacted with electric line 12 with the aid of a voltage divider 136. For this purpose, trigger terminal 134 is routed to electric line 12 with the aid of a fourth resistor 138 and to ground with the aid of a fifth resistor 139.

A time output 140 of timer 40 is routed to trigger terminal 134 with the aid of a third diode 142, a current flow to trigger terminal 134 at time output 140 being facilitated. Time output 140 is furthermore routed to a second input 144 of a logic switch 146. A first input 148 of logic switch 146 is routed to control input 34 of switch 32. Logic switch 146 has a second NOR gate 150, whose inputs form inputs 144, 148 of logic switch 146. The output of second NOR gate 150 is routed to the two inputs of a third NOR gate 152. The output of third NOR gate 152 forms an output 154 of logic switch 146, which is routed to time input 108 of shift register 42. As a result, output 154 of logic switch 148 has a level precisely when a level (signal) is present at either first input 148 or second input 144 of logic switch 146. In summary, time input 108 of shift register 42 is operatively connected to control input 34 of switch 32. Control input 34 is also routed to an input of a fourth NOR gate 154, whose other input is routed to the output of first NOR gate 82. The output of fourth NOR gate is routed to a reset terminal 156 of timer 40.

Figure 5:
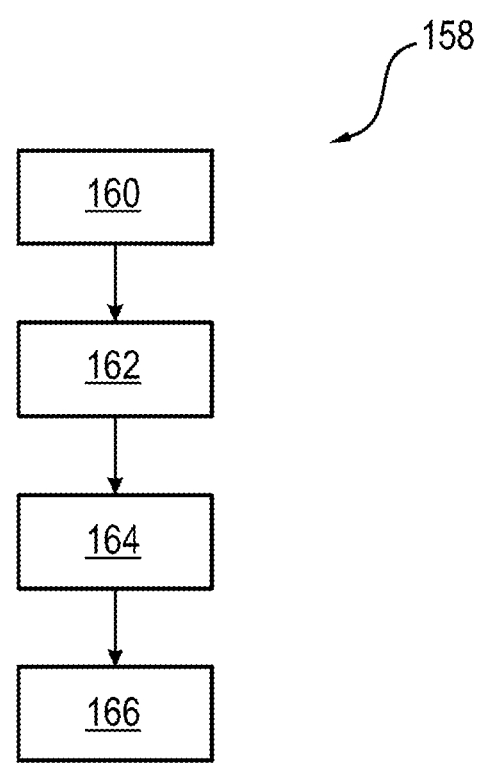
FIG. 5 shows a method for operating the disconnecting device.

FIG. 5 shows a method 158 for operating disconnecting device 24. In a first work step 160, a level is applied to reset input 106 of shift register 42 with the aid of power supply source 112, so that start output 100 is driven. In summary, an electrical voltage is present at power supply source 112, and a signal is therefore also present at reset input 106 of shift register 42 and start output 100 is therefore then driven. As a result, all switching elements 46 are blocked, and essentially no current flow is possible across voltage limiter 36. Switch 32 is in the open state, and no electrical current may flow across disconnecting device 24.

In a subsequent second work step 162, switch 32 is driven in such a way that it closes. As a result, a signal is present at control input 34, which activates timer 40. Due to logic switch 146, a level is thus present at time input 108 of shift register 42, and first output 64 is therefore driven. As a result, all switching elements 46 of phases 38 are driven due to OR logic switches 56, 58, 60, 62, so that they are electrically conductive. However, they have a higher ohmic resistance, compared to switch 32, so that electrical current essentially flows only across switch 32. Due to first NOR gate 82 and fourth NOR gate 154, timer 40 is held in a reset state, and it is ensured that timer 40 is activated only when switch 32 is in an open position, i.e. is electrically non-conductive.

In third work step 164, switch 32 is opened, so that no signal is present anymore at control input 34. As a result, the electrical current fully commutates to phases 38, so that an electrical current continues to flow across disconnecting device 24 even if a load is inductively connected to electric line 12, and a formation of a comparatively high electrical voltage at switch 32 is thus prevented. Since the ohmic resistance of voltage limiter 36 is increased compare to the ohmic resistance of switch 32, an electrical voltage arising across voltage divider 136 increases. The present electrical voltage is applied to trigger terminal 134 of timer 40 with the aid of voltage divider 136. Once this electrical voltage has dropped to one third of the operating voltage, a pulse is output across time output 140 after a certain period of time and conducted to logic chip 146. As a result, shift register 42 is controlled and its second output 84 is now driven. As a result, switching element 46 of first phase 38a is switched to the electrically non-conductive state, whereupon remaining switching elements 46 of remaining phases 38b, 38c, 38d and 38e remain electrically conductive. As a result, the electrical resistance of voltage limiter 36 is increased. The electrical voltage present at trigger terminal 134 of timer 40, in turn, therefore increases. It drops and once it again is one third of the operating voltage of timer 40, a pulse is again conducted to logic chip 146 with the aid thereof after certain periods of time in each case in additional work steps, so that third output 88 or fourth output 92 is now driven, and switching element 46 of second phase 38b or third phase 38c is therefore also now switched to the non-conductive state. Since the ohmic resistance of phases 38a, 38b, 38c, 38d, 38e is a least partially successively increased, the continuing electrical current comparatively significantly decreases.

To ensure a safe driving of shift register 42 even under weak inductive loads, timer 40 is connected as a monostable flip-flop. The minimum pulse width is determined with the aid of third resistor 132 and fourth capacitor 130. Fourth capacitor 130 is charged with the aid of third resistor 132 when a signal is present at time output 140. This takes place until the voltage present at threshold terminal 128 is less than ⅔ of the operating voltage. Since a new pulse may only begin when the electrical voltage at trigger terminal 134 has dropped below ⅓ of the operating voltage, the time output is coupled back to trigger terminal 134 with the aid of third diode 142.

When fifth output 96 of shift register 42 is driven, only switching element 46 of fifth phase 38*e* is switched to the electrically conductive state, and voltage limiter 36 therefore essentially has the ohmic resistance of resistor 44 of fifth phase 38*e*. If a pulse is now applied to time input 108 of shift register 42 in a final work step 166, end output 102 is driven. As a result, reset terminal 106 of shift register 42 is driven and consequently reset, so that start output 100 is driven. All switching elements 46 of phases 38 are also now switched to the electrically non-conductive state. As a result, the RC circuit, which is formed from additional resistor 48 and capacitor 50 as well as partially with the aid of capacitor 44 of fifth phase 38*e*, absorbs the remaining inductively stored electrical energy, so that the electrical current flowing across voltage limiter 36 is forced to zero. A discharge of capacitor 50 is ensured with the aid of additional resistor 52.

In summary, the electrical resistance of voltage limiter 36 is successively increased over time with the aid of shift register 42, an increase taking place only if the flowing electrical current is below a certain limiting value. This limiting value is set with the aid of resistors 44. As a result, a formation of a comparatively high electrical voltage is prevented when switch 32 is actuated, even under a comparatively pronounced inductive load and thus a comparative continuation of an electrical current flow. If a comparatively high current flow continues, the electrical resistance is comparatively low, so that the electrical voltage is comparatively low. Only when the electrical current is below a limiting value is the electrical resistance increased, which also increases the resulting electrical voltage. Once the electrical current has decreased again—and consequently also the present electrical voltage—is the electrical resistance, in turn, increased, so that the electrical voltage is again increased. As a result, the electrical current flow is again further reduced to an increasing degree.

The invention is not limited to the exemplary embodiment described above. Instead, other variants of the invention may be derived herefrom by those skilled in the art without going beyond the subject matter of the invention. Moreover, in particular, all individual features described in connection with the exemplary embodiment may also be otherwise combined with each other without going beyond the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A disconnecting device for interrupting current of a circuit breaker, the disconnecting device comprising:
   a switch;
   a voltage limiter connected in parallel to the switch, which has at least two phases connected in parallel to each other, each phase including a resistor, and each of the at least two phases including a switching element that is connected in series to the resistor of the phase,
   wherein the at least two phases are circuit-equivalent,
   wherein each switching element has a control input, wherein the control input of one of the switching elements is routed to a first output of a shift register and to a first input of an OR logic switch, wherein a second input of the OR logic switch is routed to a second output of the shift register, and wherein the control input of a further switching element is routed to an output of the OR logic switch.

2. The disconnecting device according to claim 1, wherein a start output of the shift register is free.

3. The disconnecting device according to claim 1, wherein a reset input of the shift register is routed to an end output of the shift register and/or a power supply source.

4. The disconnecting device according to claim 1, wherein a time input of the shift register is operatively connected to a control input of the switch.

5. The disconnecting device according to claim 4, wherein the control input of the switch is routed to a first input of a logic switch, and a time output of a timer is routed to a second input of the logic switch, and an output of the logic switch is routed to the time input of the shift register, the output of the logic switch having a level when a level is present at the first input of the logic switch and/or is present at the second input of the logic switch.

6. The disconnecting device according to claim 1, wherein a series connection of another resistor and a capacitor is connected in parallel to the switching element.

7. The disconnecting device according to claim 1, wherein the voltage limiter is based on analog technology.

8. A circuit breaker comprising a sensor and a disconnecting device according to one claim 1.

9. A method for operating a disconnecting device according to claim 1, in which the switching element is closed for a period of time after the switch is opened.

* * * * *